United States Patent
Annamalai

(10) Patent No.: US 9,034,450 B2
(45) Date of Patent: May 19, 2015

(54) BINARY SILICA-TITANIA GLASS ARTICLES HAVING A TERNARY DOPED SILICA-TITANIA CRITICAL ZONE

(75) Inventor: Sezhian Annamalai, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/564,215

(22) Filed: Aug. 1, 2012

(65) Prior Publication Data

US 2013/0052391 A1    Feb. 28, 2013

Related U.S. Application Data

(60) Provisional application No. 61/529,517, filed on Aug. 31, 2011.

(51) Int. Cl.
| | | |
|---|---|---|
| *B32B 17/00* | (2006.01) | |
| *G03F 1/22* | (2012.01) | |
| *G03F 1/00* | (2012.01) | |
| *B82Y 10/00* | (2011.01) | |
| *B82Y 40/00* | (2011.01) | |

(52) U.S. Cl.
CPC ............. *G03F 1/22* (2013.01); *Y10T 428/22* (2013.01); *G03F 1/146* (2013.01); *B82Y 10/00* (2013.01); *B82Y 40/00* (2013.01)

(58) Field of Classification Search
None
See application file for complete search history.

(56) References Cited

U.S. PATENT DOCUMENTS

| | | | | |
|---|---|---|---|---|
| 3,677,960 | A | * | 7/1972 | Ishiyama ..................... 501/72 |
| 3,785,722 | A | * | 1/1974 | Schultz ........................ 501/54 |
| 4,981,503 | A | | 1/1991 | Segawa et al. |
| 5,063,003 | A | | 11/1991 | Gonzalez-Oliver |
| 5,732,166 | A | * | 3/1998 | Hamann et al. ............... 385/12 |
| 6,289,695 | B1 | | 9/2001 | Swierkowski et al. |
| 6,764,619 | B2 | | 7/2004 | Bernas et al. |
| 6,997,015 | B2 | | 2/2006 | Bowden et al. |

(Continued)

FOREIGN PATENT DOCUMENTS

| | | |
|---|---|---|
| CA | 1339972 | 7/1998 |
| CN | 101426740 A | 5/2009 |

(Continued)

OTHER PUBLICATIONS

Mary J. Edwards et al. "Current Fabrication Techniques for ULE® and Fused Silica Light-weight Mirrors," V 3356, p. 702-711, Proceedings of SPIE, Aug. 28, 1998.*

(Continued)

*Primary Examiner* — David Sample
*Assistant Examiner* — Donald M Flores, Jr.
(74) *Attorney, Agent, or Firm* — Kevin L. Bray; Walter M. Douglas

(57) ABSTRACT

In one aspect the disclosure is directed to a binary silica-titania blank having a CTE of 0±30 ppb/° C. or less and a insert made of silica-titania-dopant(s) glass in the critical zone, wherein the dopants are selected from the group consisting of aluminum oxide, selected transition metal oxides, and amount of the dopants is in the range of 0.05 wt. % to 8 wt. % and the insert is fusion bonded to the blank with or without a frit. In various embodiments the dopants are selected from the group consisting of 0.25 wt. % to 8 wt. % $Al_2O_3$, 0.05 wt. % to 3 wt. % $Nb_2O_5$, and 0.25 wt. % to 6 wt. % $Ta_2O_5$.

11 Claims, 1 Drawing Sheet

(56) References Cited

U.S. PATENT DOCUMENTS

| | | |
|---|---|---|
| 2002/0044267 A1* | 4/2002 | Ackerman et al. .............. 355/53 |
| 2002/0059810 A1 | 5/2002 | Borrelli et al. |
| 2003/0226375 A1 | 12/2003 | Bernas et al. |
| 2005/0032622 A1 | 2/2005 | Dawes et al. |
| 2008/0004169 A1 | 1/2008 | Ellison |
| 2008/0132150 A1* | 6/2008 | Arserio et al. .................. 501/27 |
| 2011/0043787 A1 | 2/2011 | Duran |
| 2011/0048075 A1 | 3/2011 | Duran et al. |

FOREIGN PATENT DOCUMENTS

| | | |
|---|---|---|
| DE | 10 2009 043680 | 3/2011 |
| EP | 0322881 B2 | 4/1997 |
| JP | 4002625 | 1/1992 |
| JP | 4097922 | 3/1992 |
| JP | 5345628 | 12/1993 |
| JP | 7053225 | 2/1995 |
| JP | 10114533 | 5/1998 |
| WO | 2009106392 A2 | 9/2009 |

OTHER PUBLICATIONS

Machine translation of EP0322881.
Machine translation of JP4097922.
Machine translation of JP5345628.
Machine translation of JP7053225.
Machine translation of JP10114533.
Machine translation of JP1992002625, JP 4002625 A.
Machine translation of CN101426740.

* cited by examiner

BINARY SILICA-TITANIA GLASS ARTICLES HAVING A TERNARY DOPED SILICA-TITANIA CRITICAL ZONE

PRIORITY

This application claims the benefit of priority under 35 U.S.C. §119 of U.S. Provisional Application Ser. No. 61/529,517 filed on Aug. 31, 2011 the content of which is relied upon and incorporated herein by reference in its entirety.

BACKGROUND

Extreme Ultra Violet Lithography (EUVL) is the leading lithography technology for 22 nm node and lower, for example, systems using the 13-15 nm wavelength extreme ultra violet radiation, for integrated circuits (ICs) like Micro Processing Unit (MPU), Flash memory and Dynamic Random Access Memory (DRAM) articles. The advantages of using a silica-titania glass, for example, ULE® glass (Corning Incorporated, Corning, N.Y.), for EUVL system components, for example, the mirrors or partially reflective projection optics, are the polishability of the glass to the required finish or surface roughness; CTE (coefficient of thermal expansion) control of the glass and the glass's dimensional and radiation stability. These properties are critical to the functioning of the EUVL systems. Even though the current EUVL steppers use the ULE® glass, the specifications for this glass are constantly being tightened as the power of the radiation source increases, from the current 5 W to the required 100 W. While advances have been made in improving the required properties of this glass, further improvements are necessary for certain parameters such as the tolerance value for Tzc (zero crossover temperature), CTE vs. Temperature slope and Tzc spatial homogeneity. One of the ways identified to achieve to above mentioned improvements in the thermal properties of the ULE glass is by doping the glass with suitable dopants. It has also been identified that making the doped silica-titania glass by conventional flame hydrolysis or OVD process would be difficult. Also making these big EUVL projection optics parts using the doped glass by new methods like soot pressing and sol-gel process etc. would also be difficult. The large EUVL projection optics mirror blanks have smaller and thinner (<3 cm) critical zone, where most of the radiation would fall upon. The new processing techniques like sol-gel and soot-pressing can make doped silica-titania glass articles of the size of the critical zone, referred above, rather easily. The present disclosure is directed to a method of making an improved EUVL projection optics mirror parts by making the doped silica-titania glass by the new techniques and then placing it in the critical zone of the mirror blank made by traditional flame hydrolysis method by fusion bonding them with the use of a frit or without any frit. These ULE parts for the critical zone are to give better polishability, lower striae among other required properties.

SUMMARY

The present disclosure is directed to the use of a silica-titania glass containing one or more dopants, in the "critical area" or "critical zone" of a EUVL projection optics element and fusion bonding it to the regular ULE® substrate. In particular, it has been discovered that the addition of one or more dopants in the amount of 0.05-8 wt. % to the binary silica-titania glass, currently being used for these EUVL elements, results in an improved thermal properties necessary for below 25 nm node lithography. The dopants are selected from the group consisting of aluminum oxide, and selected transition metal oxides that are added to the binary silica-titania. During the course of seeking improvements in the polishability of low CTE glass we also found that the addition of a selected amounts of selected dopants to a binary silica-titania glass, for example, ULE® glass (Corning Incorporated), would enable one to achieve the required CTE slope specification for below 25 nm lithography. This will also help in achieving Tzc spatial homogeneity requirements. However, introducing the additives or dopants into the existing production methods used for making a binary silica-titania glass could complicate the methods used and could even make things worse.

In one aspect the disclosure is directed to a substrate for making mirrors for below 25 nm node EUVL lithography, the substrate consisting of a glass, glass ceramic or ceramic having a low coefficient of thermal expansion and having an insert made of doped silica-titania glass in the critical zone of the substrate and fusion bonding the two together with or without the use of frit. In one embodiment the substrate into which the insert is placed is a binary silica titania glass having a CTE of 0±30 ppb/° C. over the temperature range of 5° C. to 35° C., the insert consisting of a doped silica-titania glass, wherein the dopants are selected from the group consisting of aluminum oxide, and selected transition metal oxides, and amount of the dopants is in the range of 0.05 wt. % to 8 wt. %. In various embodiments the dopants are selected from the group consisting of 0.25 wt. % to 8 wt. % $Al_2O_3$, 0.05 wt. % to 3 wt. % $Nb_2O_5$, and 0.25 wt. % to 6 wt. % $Ta_2O_5$. The CTE of the insert would closely match the CTE of the binary silica-titania glass over the temperature range of 20° C. to 100° C. but the insert will have an improved CTE vs. T slope

DETAILED DESCRIPTION

Figure 1:
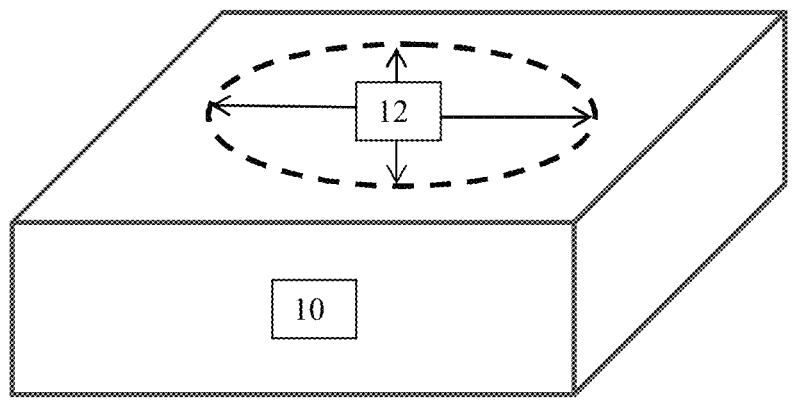
FIG. 1 is an oblique top view illustrating a typical EUVL element or blank 10 and the critical zone 12 of the element or blank.

Herein the terms "below 25 nm node lithography," and "below 25 nm element," or equivalents terms, means a lithographic system operating below 25 nm node. Herein the terms "binary silica-titania glass" and "silica-titania glass" mean a glass consisting essentially of silica and titania for example ULE® glass. Also herein the terms "doped silica-titania glass," "silica-titania-dopants glass," "doped glass" and similar terms, means a glass consisting of silica, titania and one or more additional additives or dopants as described herein. In addition, while the use of the silica-titania-dopant inserts described herein is with a binary silica-titania glass, the doped silica-titania glass can also be used as an insert with other materials, for example, glass-ceramics, that have a low CTE, for example, of 0±30 ppb/° C. over a temperature range of 5° C. to 35° C. In another embodiment the doped silica-titania glass can be used by itself for the entire element. Further herein, the terms "element blank material" and "substrate"

are used interchangeably and refer to the material into which the doped silica-titania glass is inserted.

Methods for making the doped silica-titania glass described herein are described in co-pending U.S. patent application Ser. No. 13/563,882, which was filed on Aug. 1, 2012 in the name of inventor Sezhian Annamalai, the application claiming the priority of U.S. Provisional Application No. 61/529,542 filed on Aug. 31, 2011.

Presently the largest mirror blanks are approximately 122 cm (~48 inches) in diameter and approximately 23 cm (~9 inches) thick. While it is possible to make large EUVL mirror elements containing silica, titania and selected dopants as described herein using methods such as the soot blank process, sol-gel process or soot pressing process, these routes could prove difficult and could possibly take a considerable amount of development time to insure that the components were uniformly distributed through the large silica-titania-dopants glass. Similarly making the doped silica-titania glass by the conventional flame hydrolysis process is also fraught with issues like dopant inhomogeneity and other process related complications. However, since the critical zone in these large elements is smaller in diameter compared to either the mirror blank or finished mirror, and the thickness of the critical zone is less than approximately 3 cm, we have found that the use of an "insert of a doped silica-titania glass" can provide the required thermal properties in the critical zone and making large number of these mirror blanks would also be commercially profitable. Consequently, we have found that a doped silica-titania glass insert that meets the tighter specifications required for below 25 nm node lithography can be made by a process selected from the group consisting of the soot blank process, the sol-gel method and the soot pressing process. In one embodiment the doped silica-titania glass insert is made by the sol-gel process. In another embodiment the doped silica-titania glass insert is made by the soot pressing process. Once the insert has been made out of a silica-titania-dopants glass, the insert is placed in a cavity on the surface of a binary silica-titania glass article made by any conventional process like flame hydrolysis and fusion bonded to it with the use of a frit or without the use of a frit material. Both the cavity in the binary glass article and insert are larger than the critical zone, and the thickness of the insert is less than the thickness of the binary glass article. The exact dimensions of the insert are dependent on the size of the critical zone of the EUVL element. The doped glass insert provides better thermal properties and lower striae among other required properties.

The critical zone of an element is the area upon which the radiation impinges. For EUVL which uses a 13.5 nm radiation all the materials absorb the radiation to different degrees and hence get heated up. Hence the impingement of the EUV radiation can cause heating of the critical zone. Additionally the critical zone will not be uniformly irradiated but according to the pattern that is being written on the ICs. This leads to non-uniform heating of the mirror element. Heat from the critical zone can be transferred by conduction from the critical zone to adjacent areas of the element. However, the conductive transfer of heat results in different areas of the element being at different temperatures. As a result the actual CTE at different points of the element may lie at different values on the CTE curve. The significance of this is that if an element is made of a single material and is annealed to a selected Tzc value, the heating of the mirror may cause deviations from zero CTE in the critical zone where the radiation impinges. This could cause distortions in the mirror and subsequently in the lithographic image formed. Consequently, the slope of the CTE vs. T curve needs to be improved so that even if the different parts of the mirror substrate are at different temperatures, their CTE values are not very different from each other and resulting minimum distortion of the mirror and subsequently the circuit being written on the chips.

The present disclosure is directed to the use of a doped silica-titania glass in the area of the glass element termed the "critical zone." In particular, it has been discovered that the addition of one or more selected dopants in the amount of 0.05-8 wt. % to the silica-titania glass results in an improved silica-titania glass that has improved CTE slope needed in below 25 nm node lithography. The dopants are selected from the group consisting of aluminum oxide, and selected transition metal oxides, that are added to the silica-titania glass.

Silica-titania substrates are specified within a very narrow range for the value of the average zero CTE crossover temperature, Tzc. While Tzc can be controlled by glass composition, which is defined at the time of glass forming, it can also be affected by the thermal history of the glass. Control of the composition during the glass forming stage is not always sufficiently accurate such that a particular sample or boule of glass will satisfy the requirements for a certain part if the specification for Tzc is too narrow. For example, in combustion processes where silica-containing and titanium-containing feedstocks are fed (mixed or not mixed) into burners, combusted into silica and titania, deposited in a vessel and formed into a glass, the plugging of the burners (partial or complete in one or more burners) or variations in the pump rates (for example, due to a voltage variation or pump problem) can cause some variations in the formed glass composition. In addition, while annealing after a binary glass part has been formed can improve the CTE slope by approximately 20%, this may not be sufficient and further adjustment of CTE slope is necessary. The use of the dopants has been found to be enabling of additional improvement in the CTE slope.

In one aspect the disclosure is directed to a substrate for making mirrors that can be used in EUVL steppers to make circuits that have a feature size of 22 nm node or less, the node being half the distance between adjacent features in a circuit. Currently EUVL (extreme ultraviolet lithography) uses 13.5 nm radiation for this purpose. (thus care should be taken to use the same unit, nanometers (nm)). The substrate of the present disclosure that can be used for mirrors suitable for EUVL consists of a glass, glass ceramic or ceramic having a low coefficient of thermal expansion and having an insert in the critical zone of the substrate. In one embodiment the substrate into which the insert is placed is a binary silica titania glass having a CTE of 0±30 ppm/° C., the insert consisting of a doped silica-titania glass, wherein the dopants are selected from the group consisting of aluminum oxide, and selected transition metal oxides, and the amount of the dopants is in the range of 0.05 wt. % to 8 wt. %. In various embodiments the dopants are selected from the group consisting of 0.25 wt. % to 8 wt. % $Al_2O_3$, 0.05 wt. % to 3 wt. % $Nb_2O_5$, and 0.25 wt. % to 6 wt. % $Ta_2O_5$, and mixtures thereof.

The doped silica-titania glass described herein can also be used to make photomask blank for use in any lithographic process, for example, 248 nm and 193 nm and 157 nm lithography as well as EUV lithography (13.5 nm) and many other applications requiring these superior properties.

In one embodiment the disclosure is directed to an EUVL projection optics element blank suitable for use in below 25 nm node lithography, the blank consisting of a material having a CTE of 0±30 ppb/° C. over a temperature range of 5° C. to 35° C., a cut-out in the blank for a critical zone insert, and a critical zone insert consisting of a doped silica-titania glass wherein the dopants are selected from the group consisting of aluminum oxide, and selected transition metal oxides wherein the blank material is selected from the group consisting of glass and glass-ceramic. In an embodiment the element blank material is a binary silica-titania glass having a composition in the range of (a) 94 wt. % silica and 6 wt. % titania, with a $SiO_2/TiO_2$ ratio of approximately 15.7, to (b) 92 wt. % silica and 8 wt. % titania, with a $SiO_2/TiO_2$ ratio of approximately 11.5; and the insert consists 0.05 wt. % to 8 wt. % of the dopants selected from the group consisting aluminum oxide and selected transition metal oxides, and silica and titania wt. % values have been adjusted for the wt. % of dopants added to the glass, the adjustment being such that the $SiO_2/TiO_2$ ratio remains substantially unchanged. For example, if the binary glass has a composition of 94 wt. % silica and 6 wt. % titania totaling 100 wt. % silica plus titania, the addition of 3 wt. % dopants reduces the total silica plus titania content to 97 wt. %. As a result the silica and titania content of the doped glass would be reduced by a factor of 97/100 or 0.97. Thus the silica content in the doped glass would be 94×0.97 or 91.2 wt. %, and the titania content in the doped glass would be 6×0.97 or 5.8 wt. % titania. However, the $SiO_2/TiO_2$ ratio remains substantially unchanged:

(91.2 wt. % $SiO_2$)÷(5.8 wt. % $TiO_2$)=15.7 $SiO_2/TiO_2$; and (94 wt. % $SiO_2$)÷(6 wt. % $TiO_2$)=15.7 $SiO_2/TiO_2$.

If the 92 wt. % silica and 8 wt. % titania composition were adjusted for the addition of the 3 wt. % dopant(s) the resulting doped glass would contain 3 wt. % dopant(s), 89.2 wt. % $SiO_2$ and 7.8 wt. % $TiO_2$, and the $SiO_2/TiO_2$ ratio would be 11.4. The importance of the foregoing calculations is that regardless of the amount of dopant added, the silica and titania content has to be adjusted so that the $SiO_2/TiO_2$ ratio remains relatively constant between the glass with and without the added dopant. In an embodiment the blank material is a binary silica-titania having a composition in the range of 91-95 wt. % $SiO_2$ and 5-9 wt. % $TiO_2$ and a critical zone consisting of a silica-titania-dopant(s) glass containing 0.05 wt. % to 8 wt. % dopant(s) and a silica and titania content adjusted such that the $SiO_2/TiO_2$ ratio of the silica-titania-dopant(s) glass remains relatively constant with regard to the binary glass composition.

FIG. 1 is an oblique top view illustrating a typical EUVL element or blank and the critical zone 12 of the element of the element or blank in which radiation imposes. In the present disclosure an insert is placed in the blank 10.

Figure 2:
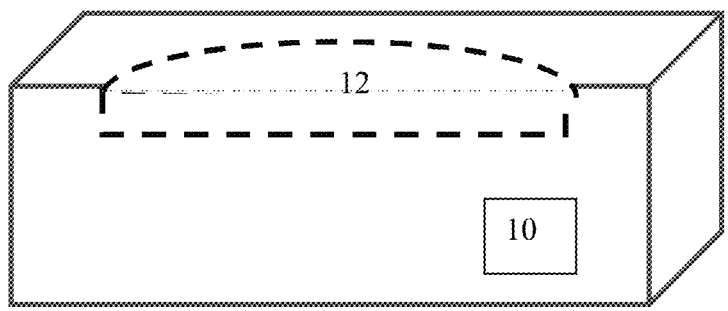
FIG. 2 is an oblique side view of a cross section of a EUVL element or blank 10 made of a binary silica-titania glass showing the critical zone 12 of the binary silica-titania glass element.

FIG. 2 is an oblique side view of a cross section of a EUVL element or blank 10 made of a binary silica-titania glass showing the critical zone 12 of the binary silica-titania glass element. The view illustrates that the thickness of the critical zone 12 is much less than the thickness of the blank/element and hence the insert will have a depth that is less than that of the blank/element 10. As indicated above the thickness or depth of the critical zone is generally less than 3 cm. The thickness of the element/blank is sized accordingly, and it can be adjusted as needed should it be found that the thickness of the critical zone is greater or smaller than expected.

Figure 3:
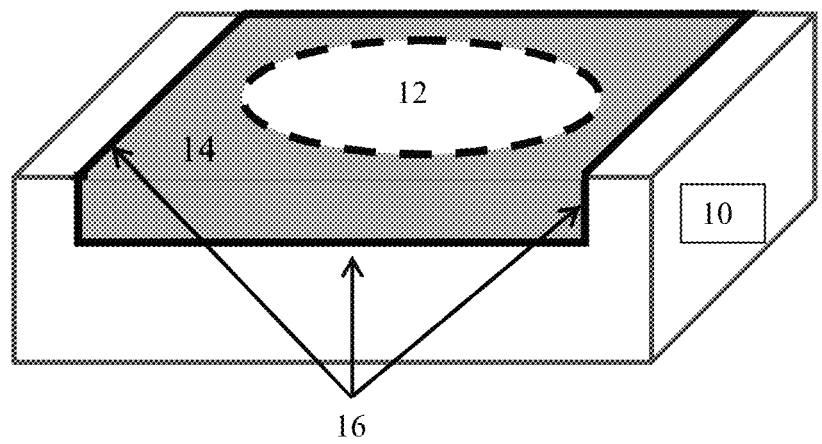
FIG. 3 is an oblique side view of a cross section of a EUVL element or blank 10 with a doped silica-titania glass 14 inserted in the element/blank 10, and further illustrating in the critical zone 12 of the insert that has been bonded to the element/blank 10, with the bonding area of insert 14 being illustrated by the heavy black lines 16.

FIG. 3 is an oblique side view of a cross section of a EUVL element or blank 10 with a doped silica-titania glass 14 inserted into the element/blank 10. The critical zone 12 is illustrated by the circle 12 (dashed line) that lies within the boundaries of the insert 14. FIG. 3 also shows the bonding between the insert 14 and the blank 10 as the heavy black lines 16 along the boundary areas between these two parts.

Thus, the disclosure is directed to an element blank suitable for use in below 25 nm lithography, the blank consisting of a material having a CTE of less than or equal to 0±30 ppb/° C. and having an insert that is fused bonded to it with or without a frit. The insert consists of a doped silica-titania glass wherein the dopants are selected from the group consisting of aluminum oxide, and selected transition metal oxides; and wherein the element blank material is selected from the group consisting of a glass or glass-ceramic. In an embodiment the element blank material is a binary silica-titania glass having a composition in the range of 6 wt. % titania and 94 wt. % silica to 8 wt. % titania and 92 wt. % silica and the insert is a doped silica-titania glass containing 0.05 wt. % to 8 wt. % dopants, the remainder being the silica and titania; and the silica and titania content of the doped glass insert is adjusted to account for the addition of the dopants while keeping the $SiO_2/TiO_2$ ratio of the binary silica-titania glass and the doped silica-titania glass substantially constant. In an embodiment the dopant is aluminum oxide in the range of 0.25-8 wt. %. In another embodiment the dopant is 0.05-6 wt. % of a dopant selected from the group consisting of $Ta_2O_5$, and $Nb_2O_5$.

While typical embodiments have been set forth for the purpose of illustration, the foregoing description should not be deemed to be a limitation on the scope of the disclosure or the appended claims. Accordingly, various modifications, adaptations, and alternatives may occur to one skilled in the art without departing from the spirit and scope of this disclosure or the appended claims.

I claim:

1. An EUVL mirror blank suitable for use in below 25 nm lithography, the mirror blank consisting of:
   (i) a silica-titania glass material having a CTE of less than or equal to 0±30 ppb/° C. over the temperature range of 5° C. to 35° C., the silica-titania glass material having a cavity for placement of an insert and
   (ii) an insert within the cavity consisting of a doped silica-titania glass wherein the doped silica-titania glass includes one or more dopants selected from the group consisting of aluminum oxide, $Ta_2O_5$, and $Nb_2O_5$; and
   wherein the insert (ii) is fusion bonded to the material (i) with or without a frit.

2. The EUVL mirror blank according to claim 1, wherein:
   the material (i) is a binary silica-titania glass having a composition in the range of 6 wt. % titania and 94 wt. % silica to 8 wt. % titania and 92 wt. % silica and
   the insert (ii) contains 0.05 wt. % to 8 wt. % of the dopants; and
   wherein the silica and titania content of the insert (ii) are adjusted to account for the addition of the dopants to keep the $SiO_2/TiO_2$ ratio of the insert (ii) the same as the $SiO_2/TiO_2$ ratio of the material (i).

3. The EUVL mirror blank according to claim 1, wherein the dopant is aluminum oxide and the insert (ii) contains the dopant in the range of 0.25-8 wt. %.

4. The EUVL mirror blank according to claim 1, wherein the dopant is $Ta_2O_5$ or $Nb_2O_5$ and the insert (ii) contains the dopant in the range of 0.05-6 wt. %.

5. The EUVL mirror blank according to claim 1, wherein the insert (ii) is fusion bonded to the material (i) with a frit material.

6. The EUVL mirror blank according to claim 1, wherein the insert (ii) is fusion bonded to the material (i) without a frit material.

7. The EUVL mirror blank according to claim 1, wherein the insert (ii) has an exposed surface and the silica-titania glass material (i) has a surface surrounding the exposed surface, the exposed surface of the insert (ii) being flush with the surrounding surface of the silica-titania glass material (i).

8. The EUVL mirror blank according to claim 1, wherein the thickness of insert (ii) is less than the thickness of the silica-titania glass material (i).

9. The EUVL mirror blank according to claim 1, wherein the insert (ii) fills the cavity of the silica-titania glass material (i).

10. The EUVL mirror blank according to claim 1, wherein the CTE slope of the doped silica-titania glass of insert (ii) is less than the CTE slope of the silica-titania glass material (i).

11. The EUVL mirror blank according to claim 1, wherein the doped silica-titania glass of insert (ii) has lower striae than the silica-titania glass material (i).

* * * * *